United States Patent [19]

Nishimura

[11] Patent Number: 4,980,895
[45] Date of Patent: Dec. 25, 1990

[54] DISTRIBUTED FEEDBACK SEMICONDUCTOR LASER HAVING A LASER-ACTIVE LAYER SERVING AS DIFFRACTION GRATING

[75] Inventor: Michiyo Nishimura, Fujisawa, Japan
[73] Assignee: Canon Kabushiki Kaisha, Tokyo, Japan
[21] Appl. No.: 327,099
[22] Filed: Mar. 22, 1989
[30] Foreign Application Priority Data Mar. 28, 1988 [JP] Japan .................................. 63-75081

[51] Int. Cl.$^5$ ................................................ H01S 3/08
[52] U.S. Cl. ........................................ 372/96; 372/45; 372/46
[58] Field of Search ........................ 372/96, 44, 45, 46; 357/17, 4

[56] References Cited

U.S. PATENT DOCUMENTS 4,654,090  3/1987  Burnham .............................. 148/1.5

FOREIGN PATENT DOCUMENTS 0158989  9/1983  Japan ..................................... 372/96
0023386  1/1986  Japan ..................................... 372/45
0184894  8/1986  Japan ..................................... 372/45
0236187  10/1986  Japan ..................................... 372/46

OTHER PUBLICATIONS

Scifres et al., "Longitudinal and Radiation Modes in GaAs Single-Heterojunction Distributed-Feedback Injection Lasers," IEEE Transactions on Electron Devices, vol. Ed-22, No. 8, Aug. 1975, pp. 609-612.
*Japanese Journal of Applied Physics,* vol. 25, No. 9, Sep., 1986, pp. L783-785, Ishida, K. et al., "Fabrication of Index-Guided AlGaAs MOW Lasers by Selective Disordering Using be Focused Ion Beam Implantation".

*Primary Examiner*—Georgia Epps
*Attorney, Agent, or Firm*—Fitzpatrick Cella Harper & Scinto

[57] ABSTRACT

A semiconductor laser which has a substrate, a laser-active layer formed on said substrate, at least a portion of said laser-active layer constituting a diffraction grating having a periodic refractive index distribution, and electrodes for supplying said laser-active layer with an electric current.

7 Claims, 4 Drawing Sheets

DISTRIBUTED FEEDBACK SEMICONDUCTOR LASER HAVING A LASER-ACTIVE LAYER SERVING AS DIFFRACTION GRATING

BACKGROUND OF THE INVENTION

1. Field of the Invention

The present invention relates to a distributed feedback semiconductor laser in which a longitudinal mode is controlled by a diffraction grating in a laser in order to obtain a dynamic single mode oscillation.

2. Description of the Related Art

Mode control of a semiconductor laser is an important factor for determining laser characteristics. A laser which provides stable oscillation characteristics at a single mode finds an increasing demand in optical communication and other fields, and intense studies have been made to develop such a laser.

In general there are three types of modes in semiconductor lasers: namely, vertical transverse mode, horizontal transverse mode and longitudinal mode. In recent years, various laser structures have been proposed in which vertical and horizontal transverse modes are well controlled.

On the other hand, the longitudinal mode has been controlled mainly by Fabry-Perot type resonator which makes use of the end surfaces of the laser cavity as reflection surfaces. This control method, however, tends to cause a multi-mode oscillation, i.e., oscillations at multiple wavelengths, particularly when high-speed modulation is performed. This has given a rise to the demand for a stable control method for realizing single mode oscillation.

To meet this demand, a laser device has been proposed in which a diffraction grating is provided in the laser to serve as a resonator. In particular, a semiconductor laser of the type referred to as a "distribution feed back" (DFB) type laser is being considered as promising. In this type of laser only a specific wavelength component is reflected or fed back by a diffraction grating arranged within a gain region.

In a known DFB type semiconductor laser, a diffraction grating is formed by providing convex and concave layers adjacent to a light-emitting laser-active layer. That is, regions of different crystalline structures are arranged periodically along the optical (light emitting) axis in the vicinity of the active layer with the borders constituted by the concavities and convexities, so that the light propagating from the active layer undergoes a periodic change in the refractive index through these regions.

This known arrangement, however, is disadvantageous in that the diffraction efficiency is small because the diffraction grating is formed in layers other than those that form the laser-active layer.

SUMMARY OF THE INVENTION

Accordingly, an object of the present invention is to provide a DFB semiconductor laser which is capable of performing a stable single-mode oscillation with a high efficiency, thereby overcoming the above-described problem of the prior art.

To this end, according to the present invention, there is provided a semiconductor laser comprising: a substrate; a laser-active layer formed on the substrate, at least a portion of the laser-active layer having a periodical refractive index distribution to form a diffraction grating; and electrodes for supplying the laser-active layer with an electric current.

The above and other objects, features and advantages of the present invention will become clear from the following description of the preferred embodiments taken in conjunction with the accompanying drawings.

DESCRIPTION OF THE PREFERRED EMBODIMENTS

Figure 1:
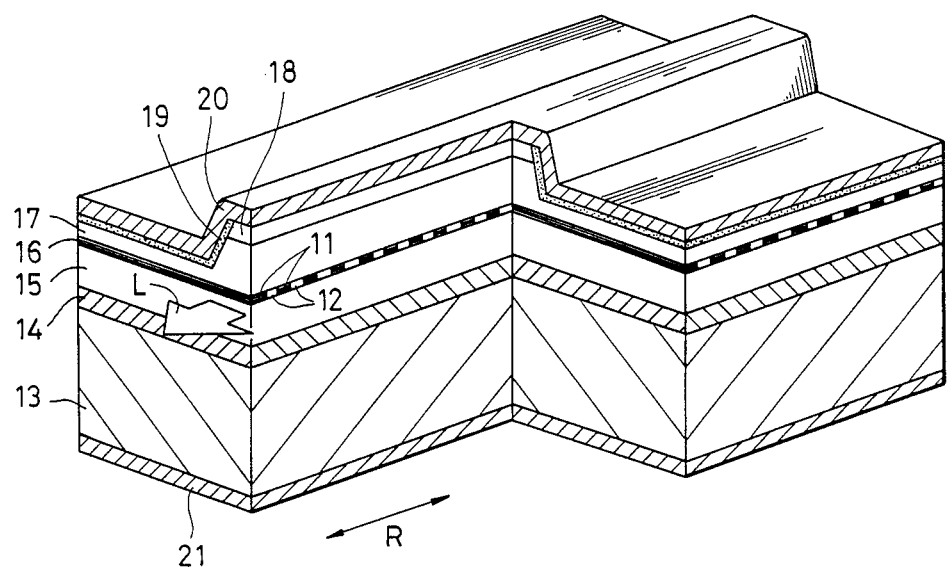
FIG. 1 is a partially cut away perspective view of an embodiment of a DFB semiconductor laser in accordance with the present invention.

A first embodiment of the DFB semiconductor laser of the present invention will be described with reference to FIG. 1 which is a perspective view of a semiconductor laser with a part thereof cut away for purposes of explanation, as well as with reference to FIGS. 2A and 2B which are schematic sectional views taken in a direction perpendicular to the direction R of resonance and in a direction parallel to the direction R of resonance, respectively. Referring to these Figures, the semiconductor laser has an n-type semiconductor substrate 13, an n-type buffer layer 14, an n-type clad layer 15, a laser-active layer 16, a p-type clad layer 17 and a cap layer 18. The p-type clad layer 17 and the cap layer 18 are mesa-etched to an intermediate depth of the clad layer 17 in such a manner as to leave stripe-shaped regions (not shown) to restrict the region where electric current is injected. An upper electrode 20 is formed through the intermediary of an insulating layer 19 which is formed to cover the clad layer 17 and the cap layer 18 except the top of the cap layer 18. A lower electrode 21 is provided under the substrate 13.

The laser-active layer 16 has regions 11 having super-lattice structure and regions 12 in which super-lattice structure is disordered, the regions 11 and 12 appearing alternatingly and periodically in the direction R of resonance. The term "super-lattice structure" in this specification is used to mean a structure in which different substances with thicknesses substantially equal to the quantum mechanical wavelength of electrons of crystal are regularly stacked in layers. The regions 11 are therefore produced by forming (e.g. by a molecular beam epitaxy process) on clad layer 15 alternating films of different substances, typically GaAs and AlGaAs, such that each film has a thickness of 20 to 100 Å. On the other hand, the regions 12 are obtained by effecting, on a super-lattice structure thus formed, diffusion of impurities or ion injection, so as to disorder the regularity of atomic arrangement of the super lattice in the desired pattern. In the regions 12 where the super-lattice structure has been disordered, crystals exist in the form of mixed crystals so that the regions 12 have a band energy gap and a refractive index which are different from those of the regions 11 of the super-lattice structure. In consequence, the laser-active layer 16 has a periodic gain distribution in the direction R of resonance, thereby forming a diffraction grating.

When an electric current is made to flow between the electrodes 20 and 21 in the DFB semiconductor laser having the described construction, recombination of carriers takes place in the laser-active layer 16 so that a light is generated. This light resonates in the direction R through the stripe regions so that a laser beam L is emitted from the end surface of the laser. The wavelength of the laser beam L thus formed is determined by the period of the aforementioned diffraction grating formed in the laser-active layer 16. That is, the semiconductor laser operates in a single longitudinal mode. The relationship between the period Λ of the diffraction grating and the Bragg wavelength $\lambda_B$ is given by the following formula:

$$\Lambda = \frac{m}{2} \cdot \frac{\lambda_B}{n_{eff}} \quad (1)$$

where, $n_{eff}$ represents the effective refractive index of the laser-active layer 16, while m represents an integer.

[EXAMPLE 1]

A DFB semiconductor laser having the construction shown in FIG. 1 was prepared as follows.

An n-type buffer layer 14 of GaAs of 1 μm thick and an n-type $Al_{0.4}Ga_{0.6}As$ clad layer 15 of 2 μm thick were formed in sequence on an n-type GaAs substrate 13. On the clad layer 15 a non-doped GaAs layer of 100Å and a non-doped $Al_{0.2}Ga_{0.8}As$ layer of 30Å. Four such pairs of layers were formed followed by formation of a GaAs layer of 100 Å, thus forming a laser-active layer 16 of a multi-quantum (super-lattice) well type structure. Then, a clad layer 17 of p-type $Al_{0.4}Ga_{0.6}As$ having a thickness of 1000 Å was formed on the active layer 16, thus forming a multi-layered structure. The formation of these layers was conducted by means of molecular beam epitaxy.

Subsequently, an Si ion beam focused into a spot was applied to the multi-layered structure from the upper side thereof as a first step in disordering the super-lattice structure, in such a manner as to scribe a grid-like pattern along the direction R. This method is known as a "Focused Ion Beam" (FIB) method. The dose rate of the beam was about $5 \times 10^{13}$ cm$^{-2}$. The pitch of the pattern formed was 0.35 μm.

Subsequently, a p-type clad layer 17 of $Al_{0.4}Ga_{0.6}As$ of 1.5 μm thick was formed and a GaAs cap layer 18 of 0.5 μm thick was formed on the clad layer 17 by means of molecular beam epitaxy. Then, in order to restrict the regions for injection of electric current, mesa-etching was conducted on the clad layer 17 and the cap layer 18 in such a manner as to leave a stripe-shaped region extending in the direction R of resonance, down to a level which is about 0.4 μm above the active layer 16, by making use of an ordinary photo-lithographic technique. An insulating layer 19 of silicon nitride was then formed by means of plasma Chemical Vapor Deposition (CVD) on the cap layer 18.

The thus formed structure was then subjected to a heat treatment which was conducted at 850° C. in an Ar gas atmosphere. As a result of the heat treatment, the super-lattice structure was disordered in the region 12 to which Si was injected by the ion beam irradiation mentioned above, whereby a diffraction grating was formed within the laser-active layer 16. In this manner, regions 12 are provided alternately with region 11 to form a diffraction grating. The pitch of the diffraction grating was 0.35 μm (corresponding to the FIB patterns), and the widths of regions 11 and 12 were approximately equal.

Subsequently, etching was effected only at the tops of the ridges of the insulating layer 19 so as to form electric current injection regions of 3 μm wide. Subsequently, a Cr-Au ohmic electrode was formed by evaporation so as to provide an upper electrode 20. The GaAs substrate 13 was machined by lapping to reduce its thickness down to 100 μm and an Au-Ge electrode was formed by evaporation so as to form an n-type ohmic electrode 21.

Subsequently, a heat treatment for diffusion was executed and, after cleavage of one of the surfaces perpendicular to the direction R of resonance, a coating of silicon nitride film was effected by a plasma CVD method such that one of these surfaces provides a low-reflection surface. The length in the direction R of resonance was determined to be about 300 μm.

On the other hand, the other surface parallel to the stripes was separated by scribing, thus forming a laser tip.

The laser tip thus formed was mounted on a stem and was excited for oscillation. The laser tip oscillated in a single mode at a waveform of 838 nm. A test pulse modulation on this laser showed that a stable modulation characteristic is obtainable up to 1.2 Gbit/sec. Assuming that the effective refractive index $n_{eff}$ of the laser-active layer 16 is 3.6, while the Bragg wavelength $\lambda_B$ is 0.838 μm, it is concluded that this laser is a DFB laser incorporating a diffraction grating of m=3.

In order to improve the operation characteristic of the laser by enhancing the light-emitting efficiency, it is preferred that the number m is selected to provide a high diffraction efficiency. Thus, it is considered that the laser is fabricated to exhibit a period which provides a condition of m=1 or m=2 with respect to the oscillation wavelength.

It was thus confirmed that a semiconductor laser capable of performing a stable laser oscillation in a single longitudinal mode is obtainable according to the present invention. It was also found that the laser-active layer is highly flat which, since etching on the laser-active layer is eliminated, reduces the possibility of layer defects.

Figure 3:
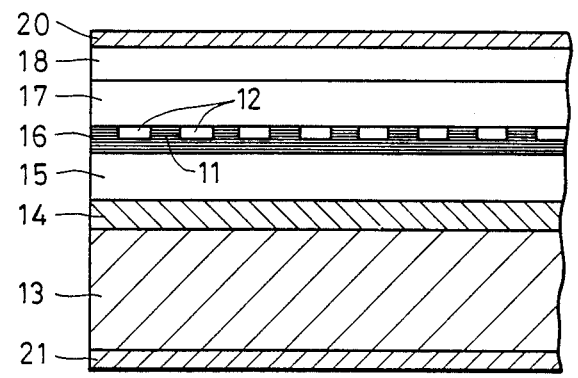
FIG. 3 is a schematic sectional view of a modification of the laser shown in FIG. 1.

In the described Example, the disordered region 12 is formed over the entire thickness of the laser-active layer 16. This, however, is not exclusive and the arrangement may be such that the disorder of the super-lattice structure is effected only on a part of the thickness of the laser-active layer 16. FIG. 3 shows such an arrangement in schematic sectional view taken in the direction R of resonance. In this Figure, the same reference numerals are used to denote the same parts as those appearing in FIG. 3 and detailed description of such parts is omitted to avoid duplication of explanation.

In the arrangement shown in FIG. 3, the region 12 is formed by disordering the super-lattice structure of the laser-active layer 16 down to an intermediate thickness of the layer 16. It is possible to adjust the refractive index distribution of this diffraction lattice by controlling this depth to which the super-lattice structure is disordered. Such a control can be effected without substantial difficulty by conducting, during growth of the laser-active layer 16 of the super-lattice structure, doping with Be ions capable of restraining disordering to a depthwise region of the layer 16 below the depth to which the disordering of the super-lattice structure is to be formed.

Figure 4:
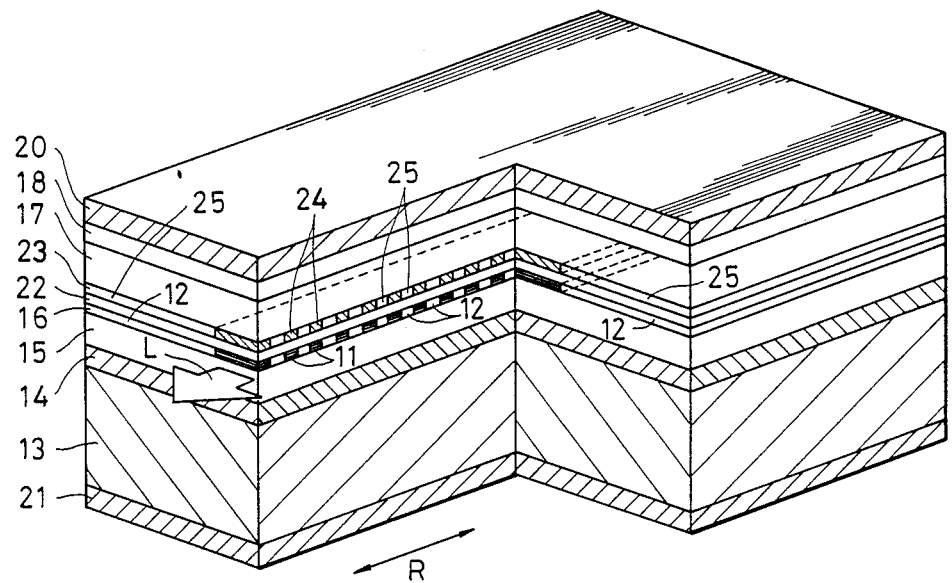
FIG. 4 is a perspective view of another embodiment of the DFB semiconductor laser in accordance with the present invention.

FIG. 4 is a partly cut-away perspective view of another example of the DFB semiconductor laser in accordance with the present invention. In this Figure, the same reference numerals are used to denote the same parts as those appearing in FIG. 1, and detailed description of such parts is omitted for avoiding duplication of explanation.

Figure 2:
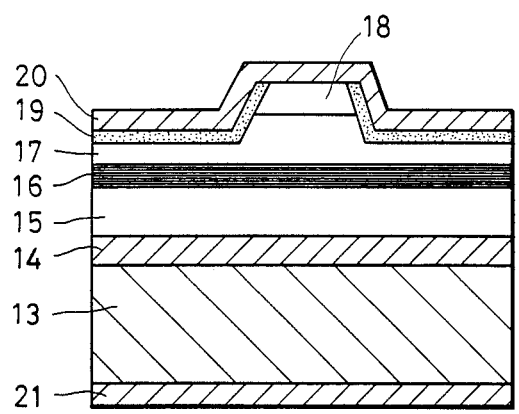
FIGS. 2A and 2B are schematic sectional views of the laser shown in FIG. 1.
Figure 2:
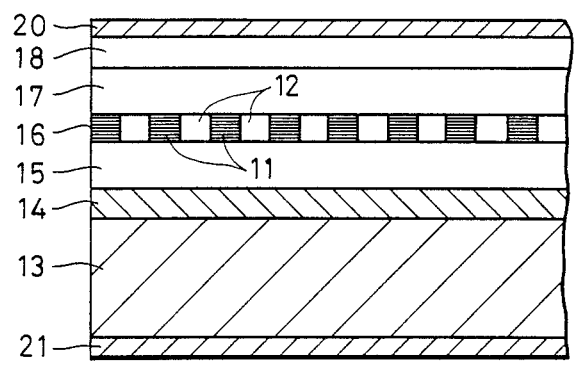

This embodiment is different from the first embodiment shown in FIG. 1 in the stripes for restricting the electric current are provided by a p-type clad layer 22 and an n-type clad layer 23 formed between the laser-active layer 16 and the p-type clad layer 17, in contrast to the first embodiment in which the stripes are provided by simple ridges. Be ions are injected into the stripe region of the n-type clad layer 23 periodically in the direction R of resonance, so as to provide p-type inverting regions 24 and n-type regions 25 alternatingly.

When a voltage is applied between the upper electrode 20 formed over the entire area of the cap layer 18 and the lower electrode 21, the interface between the clad layer 23 and the clad layer 22 is reverse-biased in each n-type region 25, so that the electric current is concentrated to the stripe regions where the p-type inverting region 24 is formed, so that the laser oscillation is triggered with a low threshold voltage.

As described before, Be ions produce an effect to restrain disordering of the super-lattice structure. Therefore, if the heat-treatment is effected after the injection of the Be ions, the super-lattice structure remains only in the portion of the laser-active layer 16 into which Be ions have been injected, whereby the super-lattice structure regions 11 and the disordered regions 12 are selectively formed. Thus, a diffraction grating is formed in the striped region of the laser-active layer 16 as in the case of the semiconductor shown in FIG. 1.

[EXAMPLE 2]

A DFB semiconductor laser having the construction shown in FIG. 4 was prepared as follows.

An n-type buffer layer 14 of GaAs of 1 μm thick and an n-type $Al_{0.4}Ga_{0.6}As$ clad layer 15 of 2 μm thick were formed in sequence on an n-type GaAs substrate 13. On the clad layer 15 were formed a Si-doped GaAs layer of 100 Å and a Si-doped $Al_{0.2}Ga_{0.8}As$ layer of 30 Å alternatingly and repeatedly (four times), followed by formation of a GaAs layer of 100 Å, thus forming a laser-active layer 16 of a multi-quantum well type structure. Then, a clad layer 22 of p-type $Al_{0.4}Ga_{0.6}As$ having a thickness of 0.2 μm and a clad layer 23 of n-type $Al_{0.4}Ga_{0.6}As$ having a thickness of 0.2 μm were formed on the active layer 16, thus forming a multi-layered structure. The formation of these layers was conducted by means of molecular beam epitaxy.

Subsequently, Be ions were injected by FIB method from the upper side of the thus-obtained layered structure only into the stripe region in such a manner as to scribe a grid-like pattern, whereby a striped p-type inversion region 24 was formed in the n-type clad layer 23 and regions 11 are prevented from destruction of their super-lattice structure. While the Be ion injection may be conducted across the entire width of the device, in the present example only a central portion of the device is subjected to FIB ion injection. Subsequently, a p-type clad layer 17 of $Al_{0.4}Ga_{0.6}As$ of 1.5 μm thick was formed and a GaAs cap layer 18 of 0.5 μm thick was formed on the clad layer 17 by means of molecular beam epitaxy.

The thus formed structure was then subjected to a heat treatment which was conducted at 850° C. in an Ar gas atmosphere. As a result of the heat treatment, the super-lattice structure was disordered in the region 12 to which Be ions were not injected by the FIB process mentioned above, whereby a striped diffraction grating was formed within the laser-active layer 16.

Subsequently, a Cr-Au ohmic electrode was formed by evaporation so as to provide an upper electrode 20 over the entire area of the cap layer 18. The GaAs substrate 13 was machined by lapping to reduce its thickness down to 100 μm and an Au-Ge electrode was formed by evaporation so as to form an n-type ohmic electrode 21.

Subsequently, a heat treatment for diffusion was executed and, after cleavage of one of the surfaces perpendicular to the direction R of resonance, a coating of silicon nitride film was effected by plasma CVD method such that one of these surfaces provides a low-reflection surface. The length in the direction R of resonance was determined to be about 300 μm.

On the other hand, the other surface parallel to the stripes was separated by scribing, thus forming a laser tip.

The laser tip thus formed was mounted on a stem and was excited for oscillation. The laser tip oscillated stably in a single mode as in the case of the embodiment shown in FIG. 1.

The DFB semiconductor laser of the present invention is characterized in that a periodical change of band gap energy is imparted to the laser-active layer so that a periodical gain distribution is formed in the direction of resonance. It is therefore necessary to take into consideration a change in the refractive index applied to the gain region by plasma effect. In such a case, the efficiency varies according to the fluctuation in the gap of the refractive index. Such a fluctuation, however, can be neglected because the oscillation wavelength is determined by the effective refractive index $n_{eff}$ rather than by individual refractive indices.

Although preferred embodiments have been described, it is to be understood that the invention can be carried out in various other manners. In recent years, for instance, a DFB laser has been developed in which both end surfaces are constructed as non-reflecting surfaces and a phase difference of ¼ wavelength is imparted to a portion of the diffraction lattice, in order to attain a high oscillation efficiency at the Bragg wavelength while restraining oscillation in the Fabre-Perot mode. Such a construction can easily be realized with the DFB semiconductor laser in accordance with the present invention, by conducting such a patterning as to bring about a ¼ wavelength shift in a portion of a diffraction grating at the time of the ion injection in the FIB process. The DFB semiconductor laser of such a construction performs a further stabilized dynamic single mode laser oscillation.

The portion to be disordered need not be an upper portion of the active layer. Various patterns of disordered region may be formed by selecting the combination of a suitable doping condition and ion type or suitably controlling the acceleration voltage.

Although the described embodiment makes use of a GaAlAs type material, various other suitable materials are usable depending on the oscillation wavelength. For instance, the present invention can be applied also to lasers which make use of materials of groups III-V or II-VI of the periodic table.

What is claimed is:

1. A semiconductor laser comprising:
   a substrate;
   a laser-active layer disposed over said substrate, said laser-active layer comprising a stripe-shaped region and a second region, a diffraction grating being formed in said stripe-shaped region by periodically arranging portions having a super-lattice structure and portions having a disordered super-lattice structure, said second region being formed by disordering of the super-lattice structure; and
   electrodes oppositely disposed relative to said laser-active layer for supplying said laser-active layer with an electric current.

2. A semiconductor laser according to claim 1, further comprising a first clad layer of a first conductivity type provided between said laser-active layer and said substrate, and a second clad layer having a second conductivity type and provided on said laser-active layer.

3. A semiconductor laser comprising:
   a substrate;
   a laser-active layer formed on said substrate, at least a portion of said laser-active layer constituting a diffraction grating having a periodic refractive index distribution;
   a first clad layer of a first conductivity type formed on said laser-active layer;
   a second clad layer formed on said first clad layer having a stripe-shaped region in which portions of the first conductivity type and portions of the second conductivity type are periodical arranged and the remainder of the region of the second conductivity type;
   a third clad layer of a first conductivity type formed on said second clad layer; and
   electrodes oppositely disposed relative to said laser-active layer for supplying said laser-active layer with an electric current.

4. A semiconductor laser according to claim 3, further comprising a fourth clad layer of a second conductivity type provided between said substrate and said laser-active layer.

5. A semiconductor laser according to claim 4, wherein said first conductivity type is p-type, and said second conductivity type is n-type.

6. A semiconductor laser according to claim 5, wherein Be ions have been injected into said p-type portion of said second clad layer.

7. A semiconductor laser according to claim 6, wherein said diffraction grating includes super-lattice portions of said laser-active layer beneath said p-type portions of said second clad layer and disordered portions of said laser-active layer not having said super-lattice structure.

* * * * *